(12) United States Patent
Basker et al.

(10) Patent No.: US 8,927,365 B2
(45) Date of Patent: Jan. 6, 2015

(54) METHOD OF EDRAM DT STRAP FORMATION IN FINFET DEVICE STRUCTURE

(75) Inventors: Veeraraghavan S. Basker, Schenetady, NY (US); Sivananda Kanakasabapathy, Niskayuna, NY (US); Tenko Yamashita, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 343 days.

(21) Appl. No.: 13/556,437

(22) Filed: Jul. 24, 2012

(65) Prior Publication Data

US 2014/0030864 A1 Jan. 30, 2014

(51) Int. Cl.
*H01L 21/8242* (2006.01)

(52) U.S. Cl.
USPC ........... 438/243; 438/386; 438/387; 257/308; 257/E21.652

(58) Field of Classification Search
USPC .................. 438/243, 386, 387; 257/296, 308, 257/E21.651, E21.652, E21.396
See application file for complete search history.

(56) References Cited

U.S. PATENT DOCUMENTS

| 5,846,881 | A | 12/1998 | Sandhu et al. ................ 438/683 |
| 6,503,798 | B1 | 1/2003 | Divakaruni et al. .......... 438/268 |
| 6,998,676 | B2 * | 2/2006 | Kondo et al. .................. 257/329 |
| 7,851,283 | B2 | 12/2010 | Anderson et al. ............. 438/164 |
| 8,030,707 | B2 | 10/2011 | Cheng et al. ................... 257/347 |
| 2009/0184356 | A1 | 7/2009 | Brodsky et al. ............... 257/301 |
| 2009/0184392 | A1 | 7/2009 | Cheng et al. ................... 257/532 |
| 2011/0248326 | A1 | 10/2011 | Kanakasabapathy et al. ............................. 257/300 |

OTHER PUBLICATIONS

"Diagonal Layout & Surface Strap Trench (DST) cell", T. Kajiyama, et al., IEEE 2000, 4 pgs.
"Scaling Deep Trench Based eDRAM on SOI to 32nm and Beyond", G. Wang, et al., IEEE, 2009, 4 pgs.

* cited by examiner

Primary Examiner — David Vu
(74) Attorney, Agent, or Firm — Harrington & Smith

(57) ABSTRACT

The specification and drawings present a new method, device and computer/software related product (e.g., a computer readable memory) are presented for realizing eDRAM strap formation in Fin FET device structures. Semiconductor on insulator (SOI) substrate comprising at least an insulator layer between a first semiconductor layer and a second semiconductor layer is provided. The (metal) strap formation is accomplished by depositing conductive layer on fins portion of the second semiconductor layer (Si) and a semiconductor material (polysilicon) in each DT capacitor extending to the second semiconductor layer. The metal strap is sealed by a nitride spacer to prevent the shorts between PWL and DT capacitors.

20 Claims, 7 Drawing Sheets

METHOD OF EDRAM DT STRAP FORMATION IN FINFET DEVICE STRUCTURE

TECHNICAL FIELD

The exemplary embodiments of this invention relate generally to semiconductor devices and more particularly to eDRAM strap formation in Fin FET devices structures.

BACKGROUND

The following abbreviations that may be found in the specification and/or the drawing figures are defined as follows:
BOX buried oxide
DT deep trench
DT capacitor deep trench capacitor
DRAM dynamic random access memory
eDRAM embedded dynamic random access memory
eSRAM embedded static random access memory
FET field effect transistor
Epi epitaxial growth
FiN fin-type
FinFET fin-type FET
IC integrated circuit
MOSFET metal-oxide-semiconductor FET
RF radio frequency
RIE reactive ion etching
SOI semiconductor on insulator
SRAM static random access memory
TTO trench top oxide
TTN trench top nitride
PWL passing word line
WL word line
HM hard mask
DTMO deep trench mask open
DT RIE deep trench reactive ion etching It is a common practice to integrate memory and logic functions on a common semiconductor substrate. In such a configuration, when the memory function is performed by a dynamic random access memory (DRAM) cell, the circuitry is referred to as embedded DRAM (eDRAM).

The use of undoped channel devices such as fin-field effect transistors (FinFETs) for memory (both static random access memory (SRAM) and DRAM) has been proposed for this reason. However, the integration of FinFETs with planar logic is difficult due to vertical topography, especially since DRAM processes generally rely on bulk silicon wafer substrates. Various problems in extrapolating planar DRAM technology to FinFETs lie in the fact that there is no unprocessed side to the body of the transistor where the capacitor can be strapped to. Also, the thin body of the Fin allows for very little overlap area for intimate electrical contact.

Dual-gate non-planar FETs are FETs in which a channel region is formed in the center of a thin semiconductor fin. The source and drain regions are formed in the opposing ends of the fin on either side of the channel region. Gates are formed on each side of the thin semiconductor fin, and in some cases, on the top or bottom of the fin as well, in an area corresponding to the channel region. FinFETs specifically are dual-gate non-planar FETs in which the fin is so thin as to be fully depleted. The effective fin width is determined by the fin height (e.g., short wide fins can cause partial depletion of a channel). For a FinFET, a fin thickness of approximately one-fourth the length of the gate (or less) can ensure suppression of deleterious short-channel effects, such as variability in threshold voltage and excessive drain leakage currents. Fin-FETs are discussed at length in U.S. Pat. No. 6,413,802 to Hu et al., which is incorporated herein by reference Deep trenches, typically having a depth exceeding one micron in contrast to shallow trenches having a depth less than one micron, are employed in the semiconductor industry to provide a variety of useful devices including a deep trench capacitor. The deep trenches may be utilized in a stand-alone semiconductor circuit such as a dynamic random access memory (DRAM) circuit to provide deep trench capacitors, or may be utilized as an embedded circuit component of a semiconductor chip that also includes other semiconductor circuits such as a processor core or other logic circuits. Particularly, embedded capacitors employing a deep trench are employed to enable an embedded memory device, e.g., an embedded dynamic random access memory (eDRAM) cell, a passive component of a radio frequency (RF) circuit, and decoupling capacitors that provide a stable voltage supply in a semiconductor circuit.

Semiconductor-on-insulator (SOI) substrates are employed in the semiconductor industry for performance benefits due to reduced capacitive coupling between semiconductor devices and the bulk portion of the substrate provided by a buried insulator layer. High performance logic chips are frequently manufactured on an SOI substrate to provide enhanced performance over devices having comparable dimensions and manufactured on a bulk substrate.

SUMMARY

According to a first aspect of the invention, a method for forming an embedded dynamic random access memory (eDRAM) deep trench (DT) strap formation in a fin-shaped field effect transistor (FinFET) device structure, the method comprising: providing a semiconductor on insulator (SOI) substrate comprising at least an insulator layer between a first semiconductor layer and a second semiconductor layer; forming a plurality of deep trench (DT) capacitors in the first semiconductor layer of the SOI substrate for the eDRAM, with a semiconductor material in each DT capacitor extending to the second semiconductor layer; forming a plurality of fins for FinFETs by selectively removing at least the second semiconductor layer up to a top of the insulator layer, where every fin of the plurality of fins comprises a portion of the second semiconductor layer and at least partially overlaps on the top of the insulator layer with at least two DT capacitors of the plurality of the DT capacitors; and depositing a layer of a conductive material on the fins including side walls to form a strap between the portion of the second semiconductor layer comprised in each fin and the semiconductor material in each DT capacitor-extending to the second semiconductor layer.

According to a second aspect of the invention, a data processing system that comprises at least one data processor connected with at least one memory that stores computer program instructions for fabricating an embedded dynamic random access memory (eDRAM) deep trench (DT) strap formation in a fin-shaped field effect transistor (FinFET) device structure by: providing a semiconductor on insulator (SOI) substrate comprising at least an insulator layer between a first semiconductor layer and a second semiconductor layer; forming a plurality of deep trench (DT) capacitors in the first semiconductor layer of the SOI substrate for the eDRAM, with a semiconductor material in each DT capacitor extending to the second semiconductor layer; forming a plurality of fins for FinFETs by selectively removing at least the second semiconductor layer up to a top of the insulator layer, where every fin of the plurality of fins comprises a portion of the second semiconductor layer and at least partially overlaps on the top of the insulator layer with at least two DT capacitors of the plurality of the DT capacitors; and depositing a layer of a conductive material on the fins including side walls to form a strap between the portion of the second semiconductor layer comprised in each fin and the semiconductor material in each DT capacitor-extending to the second semiconductor layer.

According to a third aspect of the invention, a computer-readable memory that contains computer program instructions, where the execution of the computer program instructions by at least one data processor results in performance of operations that comprise fabricating an embedded dynamic random access memory (eDRAM) deep trench (DT) strap formation in a fin-shaped field effect transistor (FinFET) device structure by: providing a semiconductor on insulator (SOI) substrate comprising at least an insulator layer between a first semiconductor layer and a second semiconductor layer; forming a plurality of deep trench (DT) capacitors in the first semiconductor layer of the SOI substrate for the eDRAM, with a semiconductor material in each DT capacitor extending to the second semiconductor layer; forming a plurality of fins for FinFETs by selectively removing at least the second semiconductor layer up to a top of the insulator layer, where every fin of the plurality of fins comprises a portion of the second semiconductor layer and at least partially overlaps on the top of the insulator layer with at least two DT capacitors of the plurality of the DT capacitors; and depositing a layer of a conductive material on the fins including side walls to form a strap between the portion of the second semiconductor layer comprised in each fin and the semiconductor material in each DT capacitor-extending to the second semiconductor layer.

DETAILED DESCRIPTION

A new method, device and computer/software related products (e.g., a computer readable memory) are presented for realizing eDRAM strap formation in Fin FET device structures.

According to embodiments of the invention, an embedded dynamic random access memory (eDRAM) deep trench (DT) strap formation in a fin-shaped field effect transistor (FinFET) device structure may be formed as follows. First, a semiconductor on insulator (SOI) substrate comprising at least an insulator layer between a first semiconductor layer and a second semiconductor layer is provided. This is followed at least by forming a plurality of deep trench (DT) capacitors in the first semiconductor layer of the SOI substrate for the eDRAM, with a semiconductor material in each DT capacitor extending to the second semiconductor layer. Then a plurality of fins for FinFETs are formed by selectively removing at least the second semiconductor layer up to a top of the insulator layer, where every fin of the plurality of fins comprises a portion of the second semiconductor layer and at least partially overlaps on the top of the insulator layer with at least two DT capacitors of the plurality of the DT capacitors. This is followed by depositing a conductive layer on the fins including side walls to form a strap between the portion of the second semiconductor layer comprised in each fin and the semiconductor material in each DT capacitor extending to the second semiconductor layer.

FIGS. 1 2a-2b and 3a-3b, 4a-4b, 5a-5b and 6a-6b illustrate exemplary processing steps for realizing eDRAM DT strap formation in the FinFET device structure.

Figure 1:
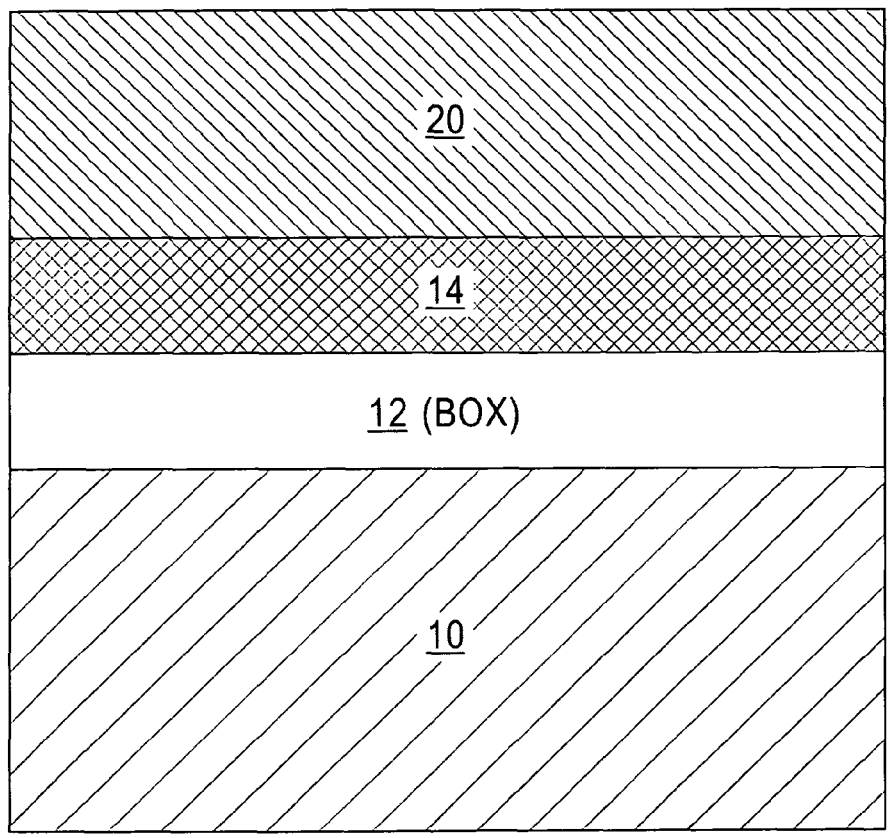
FIG. 1 is a sectional view depicting SOI substrate for implementing embodiments of the invention.

FIG. 1 shows a starting structure 2 which can be used for implementing embodiments of the invention. It comprises a SOI substrate containing an insulator layer 12 between a first (lower) semiconductor layer 10 and a second (upper) semiconductor layer 14, the second semiconducting layer may be intrinsic or comprising a dopant of low concentration, whereas the semiconducting layers may comprise a dopant of medium to high dopant concentration.

The first semiconductor layer 10 can be made of any appropriate semiconductor material including, but not limited to: Si, Ge, GaP, InAs, InP, SiGe, GaAs, silicon-germanium-carbon alloy, III-V compound semiconductor materials, II-VI compound semiconductor materials, organic semiconductor materials, and other compound semiconductor material. The second semiconductor layer 14 may comprise the same semiconductor material as the first semiconductor layer 10 or a different semiconductor material. In a non-limiting example, the first semiconductor layer 10 and/or second semiconductor layer 14 may be a single crystal silicon.

The (buried) insulator layer 12 may be formed on the first semiconductor layer 10 using any of a variety of techniques. For example, a separation by implantation and oxidation (SIMOX) technique or wafer bonding and etch-back technique may be used. The insulator layer 12 can have an insulating material such as buried oxide (BOX). The buried insulator layer 12 may comprise a dielectric material such as silicon oxide ($SiO_2$) and/or silicon nitride ($Si_3N_4$). For example, the buried insulator layer 20 may comprise thermal silicon oxide. However, any other type and/or combination of buried insulator material may also be used for the insulator layer 12.

The second semiconductor layers 14 may be undoped, or may have a p-type doping or an n-type doping at a low dopant concentration from about $10^{13}$ atom/cm$^3$ to about $10^{16}$ atom/cm$^3$. The first semiconductor layers 10 may have a p-type doping or an n-type doping at a medium to high dopant concentration from about $10^{17}$/cm$^3$ to about $10^{21}$ atom/cm$^3$. The thickness of the top semiconductor layer 14 may be from about 5 nm to about 300 nm, and preferably from about 20 nm to about 100 nm. The top semiconductor layer 14 may have a built-in biaxial stress in a horizontal plane, i.e., in the plane parallel to the interface between the buried insulator layer 12 and the top semiconductor layer 14 (AF: please cheek if this is still applied?). The thickness of the insulator layer 12 may be from about 20 nm to about 500 nm, and typically from about 100 nm to about 200 nm.

The hardmask oxide layer 20 (hardmask) may comprise a dielectric oxide formed by chemical vapor deposition. For example, the hardmask oxide layer 20 may comprise an undoped silicate glass (USG) or a doped silicate glass such as borosilicate glass (BSG). The hardmask oxide layer 20 may be formed by chemical vapor deposition such as low pressure chemical vapor deposition (LPCVD), rapid thermal chemical vapor deposition (RTCVD), plasma enhanced chemical vapor deposition (PECVD), and high density plasma chemical vapor deposition (HDPCVD). The thickness of the hardmask oxide layer 20 may be from about 300 nm to about 1,200 nm, and typically from about 500 nm to about 1,000 nm, although lesser and greater thickness are possible too.

Figure 2A:
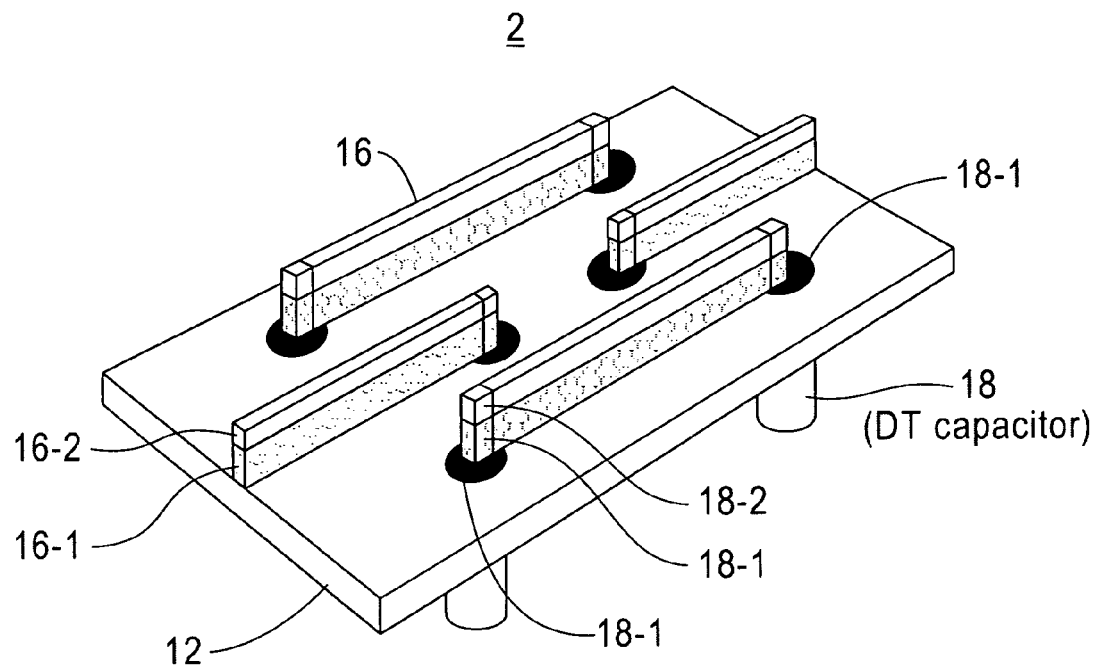
FIGS. 2a-2b are a perspective view (FIG. 2a) and a top view (FIG. 2b) depicting forming DT capacitors and fins for FinFETs overlapping with DT capacitors.
Figure 2B:
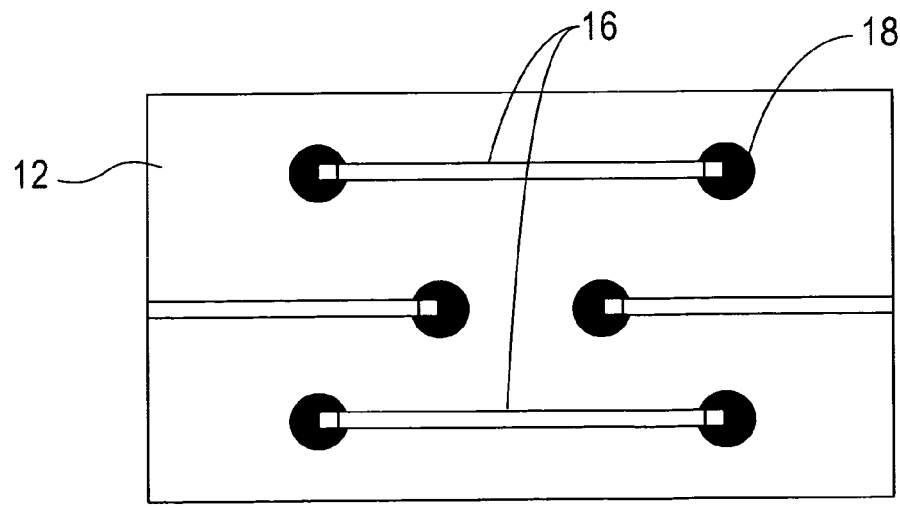

FIGS. 2a (perspective view) and 2b (top view) show DT capacitors 18 in the first semiconductor layer 10 (shown in FIG. 1) for the eDRAM using a variety of methods known in the art (e.g., see U.S. Patent Application Publication Numbers 2012/0104547, 2009/0184356 and the like). A semiconductor material 18-1 such as polysilicon in each DT capacitor extends to the second semiconductor layer 14 (shown in FIG. 1) above the insulator layer (BOX) 12. Typically, the DT capacitors may have a width of about 50 mn to 200 mn and a depth from about 1000 nm to about 10000 nm Also FIGS. 2a and 2b show a plurality of fins 16 for FinFETs formed by selectively removing (and forming further deep trenches using a deep trench mask open patterning) at least the second semiconductor layer 14 (shown in FIG. 1) up to a top of the insulator layer 12, where every fin of the plurality of fins comprises a portion 16-1 of the second semiconductor layer 14 and at least partially overlaps on the top of the insulator layer 12 with at least two DT capacitors 18 of the plurality of the DT capacitor. The fins typically have a thickness from about 5 nm to 15 nm, and a height from about 10 to 35 nm.

It is further noted that fins 16 may also comprise remnants 16-2 of the hardmask oxide layer 20 shown in FIG. 1 (as known in the art, the hardmask oxide layer 20 may be used, e.g., for opening DTs for capacitors 18 during RIE). Also remnants of the hardmask oxide material 18-2 (filled in after completing processing of the DT capacitors 18) may be comprised in the fins 16.

Figure 3A:
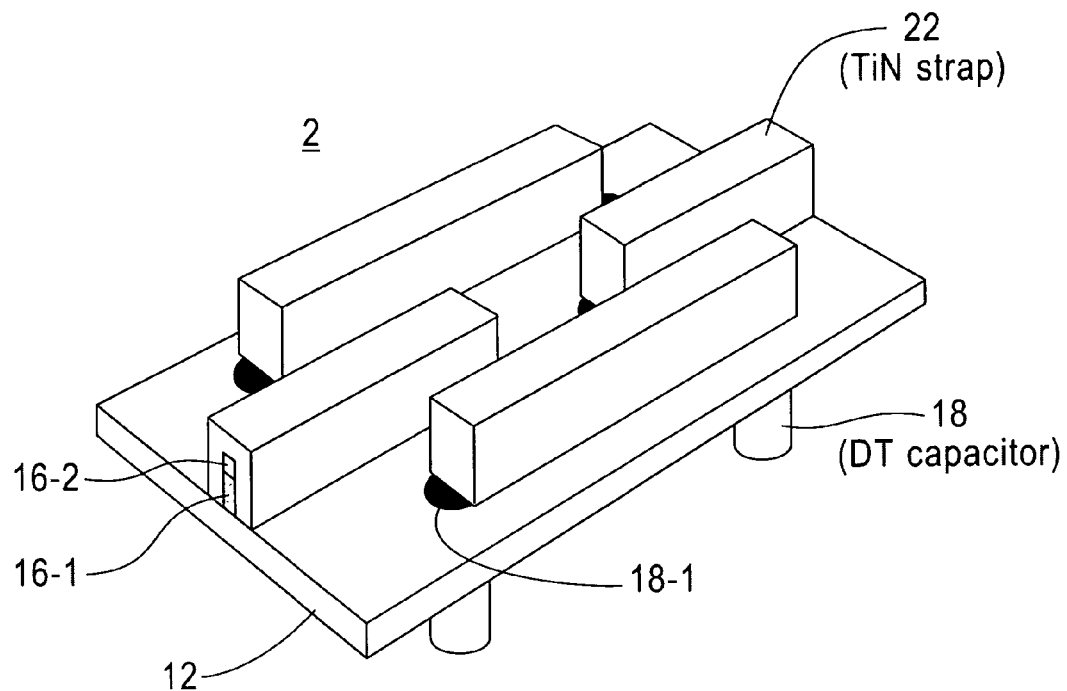
FIGS. 3a-3b are a perspective view (FIG. 3a) and a top view (FIG. 3b) depicting a layer of a conductive material such as TiN deposited on the fins to form a strap formation.
Figure 3B:
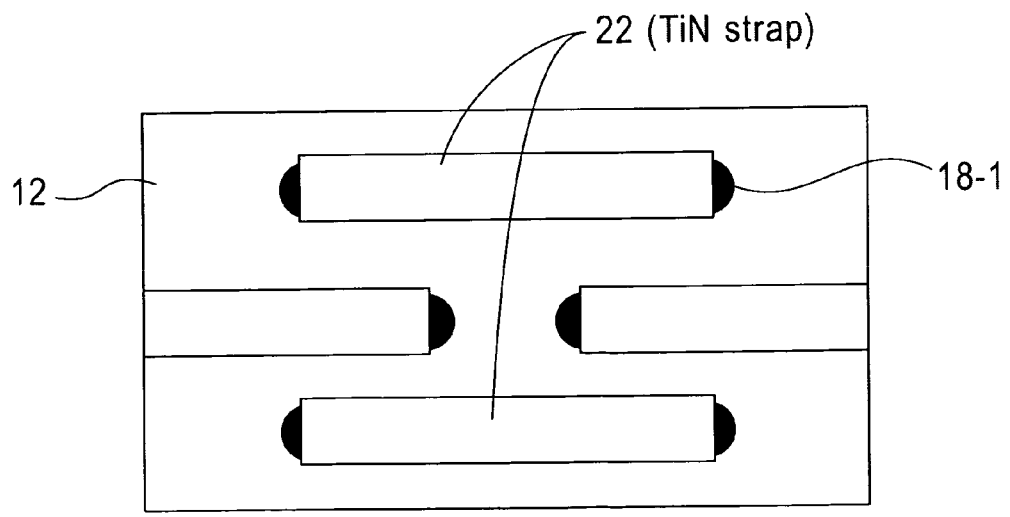

FIGS. 3a (perspective view) and 3b (top view) show a layer of a conductive material 20 such as TiN (in general it may be TiN, TaC, TaN, TaAlN, TiAlN, W, Ti, Ta, Mo or other refractory materials and their derivatives) deposited on the fins 16 (including side walls) to form a strap between the portion of the second semiconductor layer 16-1 comprised in each fin and the semiconductor material 18-1 such as polysilicon in each DT capacitor 18 extending to the second semiconductor layer. Typically the conductive layer may have a thickness from about 5 to 15 nm. The conductive material is removed from the areas outside of the fins 16, e.g., by the RIE as shown in FIGS. 3a and 3b. The strap formation is further facilitated by annealing performed later in the processing sequence which is discussed herein.

Figure 4A:
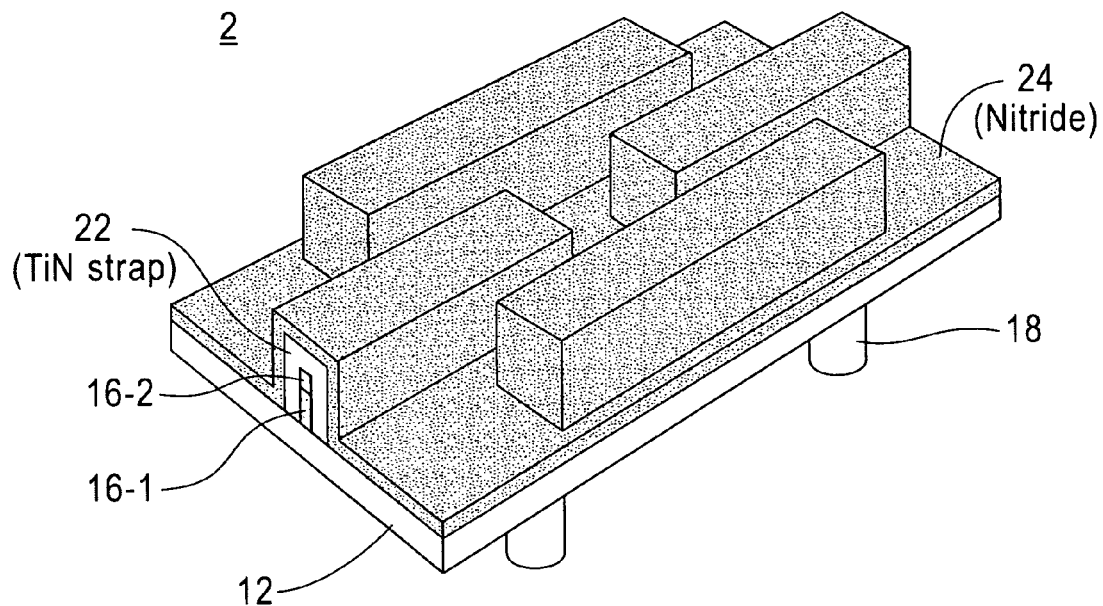
FIGS. 4a-4b are a perspective view (FIG. 4a) and a top view (FIG. 4b) depicting depositing a TTO/TTN layer such as nitride.
Figure 4B:
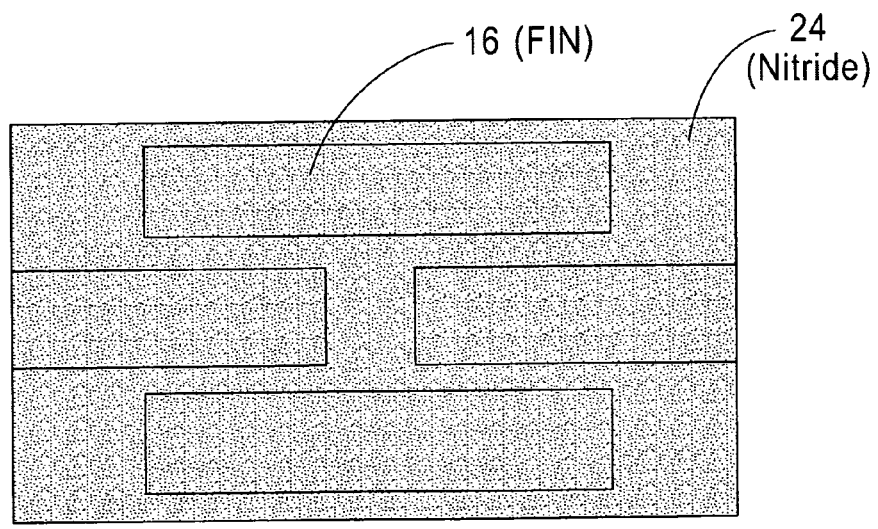
Figure 5A:
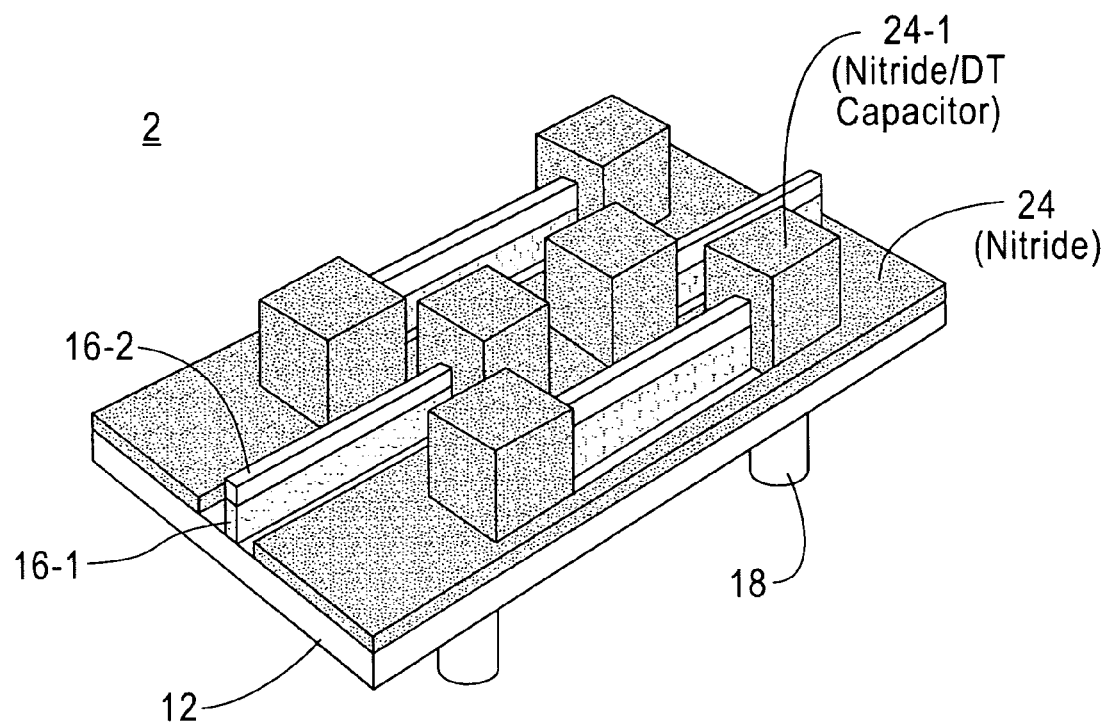
FIGS. 5a-5b are a perspective view (FIG. 5a) and a top view (FIG. 5b) depicting patterning the TTO/TTN (nitride) layer to open corresponding fin areas and removing conducting material (TiN) from the corresponding exposed fin areas.
Figure 5B:
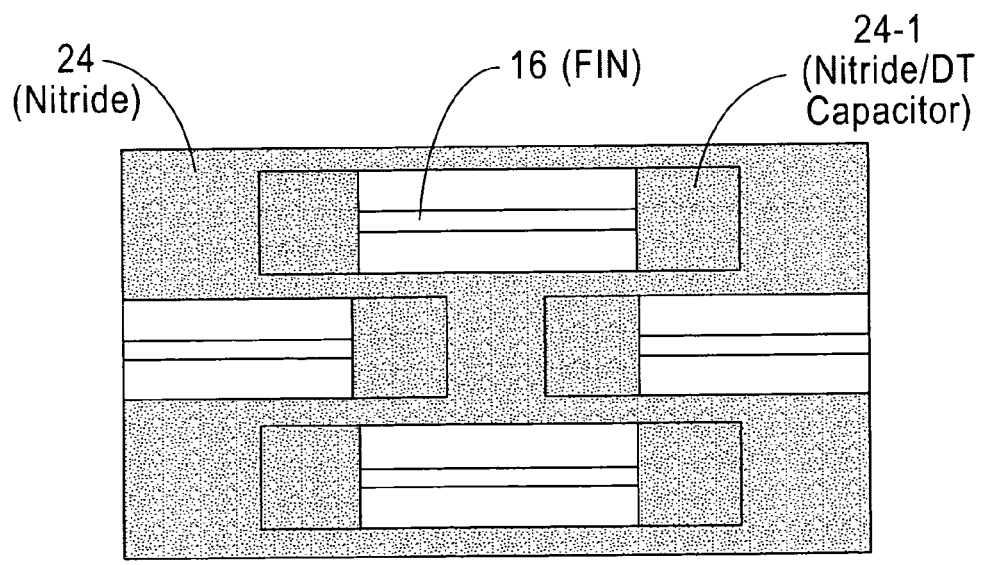

FIGS. 4a-4b, 5a-5b and 6a-6b demonstrate further processing steps for completing the FinFET device structure and strap formation. FIGS. 4a (perspective view) and 4b (top view) show a step of depositing a trench top oxide or trench top nitide (TTO/TTN) layer 24 such as nitride. Subsequently as shown in FIGS. 5a (perspective view) and 5b (top view), the TTO/TTN (nitride) layer 24 is patterned (e.g., using RIE) to open corresponding fin areas and to form gate areas 24-1 by leaving the nitride to protect appropriate overlapping portions of the fins and DT capacitors. Subsequently conducting material (TiN) is removed from the corresponding exposed fin areas, i.e., not covered by the TTO/TTN layer as shown in FIGS. 5a and 5b.

After that, the strap formation is further facilitated by annealing (typically at temperatures between about 200 and 900° C.) to form a silicide (e.g., TiSi) on the boundaries between the conductive strap material such as TiN 22 and the portion of the second semiconductor layer 16-1 such as Si comprised in each fin 16 and on the boundaries between the conductive strap material such as TiN 22 and the semiconductor material such as polysilicon 18-1 in each DT capacitor 18 extending to the second semiconductor layer, thus forming reliable electrical connections.

Figure 6A:
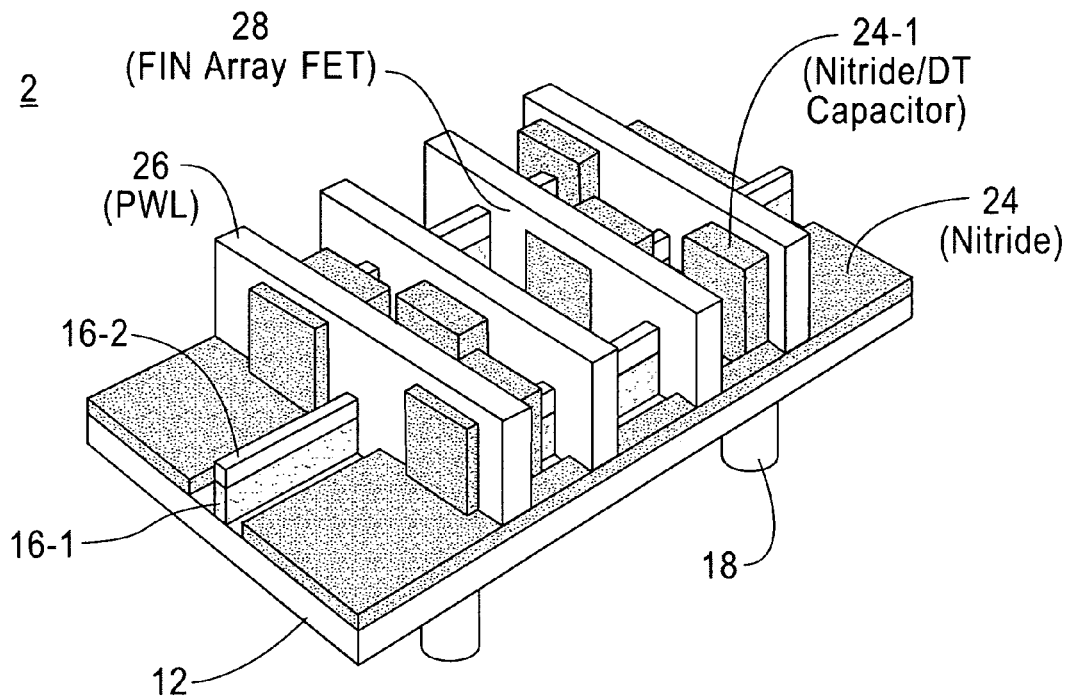
FIGS. 6a-6b are a perspective view (FIG. 6a) and a top view (FIG. 6b) depicting passing word lines (PWL) formed on the top of the corresponding open fin areas to complete the FIN array FET structure.
Figure 6B:
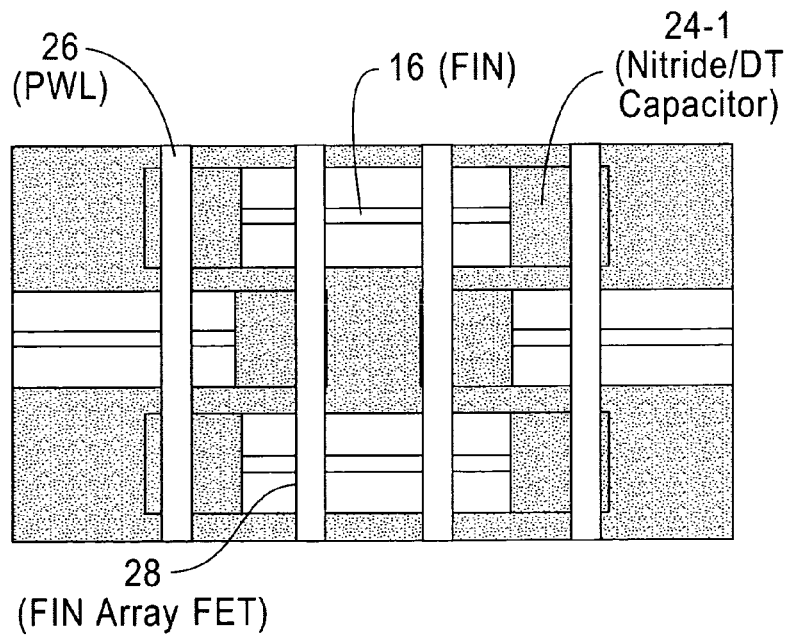

Finally, passing word lines (PWL) 26 are formed on the top of the corresponding open fin areas to complete the FIN array FET 28, as shown in FIGS. 6a (perspective view) and 6b (top view). The metal strap is sealed by a nitride spacer to prevent the shorts between PWL and DT capacitors.

Figure 7:
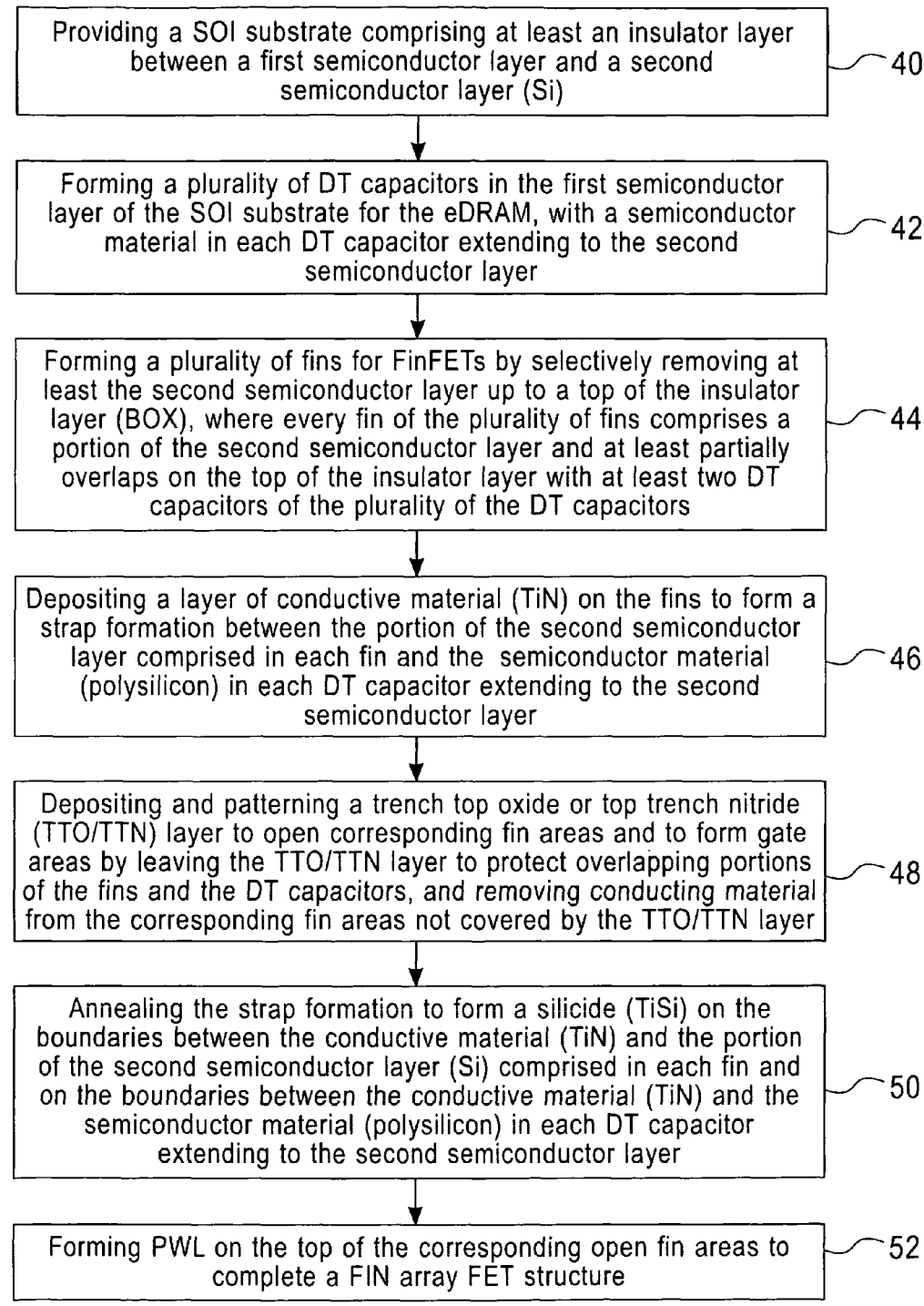
FIG. 7 are flow process chart demonstrating implementation of exemplary embodiments of the invention.

FIG. 7 shows an exemplary flow process demonstrating implementation of embodiments of the invention. It is noted that the order of steps shown in FIG. 7 is not absolutely required, so in principle, the various steps may be performed out of the illustrated order. Also certain steps may be skipped, different steps may be added or substituted, or selected steps or groups of steps may be performed in a separate application.

In a method according to this exemplary embodiment, as shown in FIG. 7, in a first step 40, a SOI substrate comprising at least an insulator layer between a first semiconductor layer and a second semiconductor layer (Si) is provided as described herein (FIG. 1).

In a next step 42, a plurality of DT capacitors are formed in the first semiconductor layer of the SOI substrate for the eDRAM, with a semiconductor material in each DT capacitor extending to the second semiconductor layer, as described herein (FIGS. 2 and 2b).

In a next step 44, a plurality of fins for FinFETs are formed by selectively removing at least the second semiconductor layer up to a top of the insulator layer (BOX), where every fin of the plurality of fins comprises a portion of the second semiconductor layer and at least partially overlaps on the top of the insulator layer with at least two DT capacitors of the plurality of the DT capacitors, as described herein (FIGS. 2 and 2b).

In a next step 46, a layer of conductive material (TiN) is deposited on the fins including side walls to form a strap between the portion of the second semiconductor layer comprised in each fin and the semiconductor material (polysilicon) in each DT capacitor extending to the second semiconductor layer.

In a next step 48, a trench top oxide or top trench nitride (TTO/TTN) layer is deposited and patterned to open corresponding fin areas and to form gate areas by leaving the TTO/TTN such as nitride layer to protect overlapping portions of the fins and the DT capacitors, and further removing conducting material from the corresponding exposed fin areas not covered by the TTO/TTN layer.

In a next step 50, the strap is annealed to form a silicide (TiSi) on the boundaries between the conductive material (TiN) and the portion of the second semiconductor layer (Si) comprised in each fin and on the boundaries between the conductive material (TiN) and the semiconductor material (polysilicon) in each DT capacitor-extending to the second semiconductor layer.

Finally, in a next step 52, PWLs are formed on the top of the corresponding open fin areas to complete the FIN array FET structure.

It is noted that various non-limiting embodiments described herein may be used separately, combined or selectively combined for specific applications.

Further, some of the various features of the above non-limiting embodiments may be used to advantage without the corresponding use of other described features. The foregoing description should therefore be considered as merely illustrative of the principles, teachings and exemplary embodiments of this invention, and not in limitation thereof.

It is to be understood that the above-described arrangements are only illustrative of the application of the principles of the present invention. Numerous modifications and alternative arrangements may be devised by those skilled in the art without departing from the scope of the invention, and the appended claims are intended to cover such modifications and arrangements.

As should be appreciated by one skilled in the art, aspects of the present invention may be embodied as a method, a computer-readable memory, a data processing system, a semiconductor device, or as a combination of these. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit", "device", "module" or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document a computer readable storage medium may be any tangible, non-transitory medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the computer, partly on the computer, as a stand-alone software package, partly on the computer and partly on a remote computer or entirely on the remote computer or server. In the latter scenario, the remote computer may be connected to the computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, devices, apparatuses, systems and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent mathematical expressions may be used by those skilled in the art. However, all such and similar modifications of the teachings of this invention will still fall within the scope of this invention.

The invention claimed is:

1. A method for forming an embedded dynamic random access memory (eDRAM) deep trench (DT) strap formation in a fin-shaped field effect transistor (FinFET) device structure, the method comprising:
providing a semiconductor on insulator (SOI) substrate comprising at least an insulator layer between a first semiconductor layer and a second semiconductor layer;
forming a plurality of deep trench (DT) capacitors in the first semiconductor layer of the SOI substrate for the eDRAM, with a semiconductor material in each DT capacitor extending to the second semiconductor layer;
forming a plurality of fins for FinFETs by selectively removing at least the second semiconductor layer up to a top of the insulator layer, where every fin of the plurality of fins comprises a portion of the second semiconductor layer and at least partially overlaps on the top of the insulator layer with at least two DT capacitors of the plurality of the DT capacitors; and
depositing a layer of a conductive material on the fins including side walls to form a strap between the portion of the second semiconductor layer comprised in each fin and the semiconductor material in each DT capacitor-extending to the second semiconductor layer.

2. The method of claim 1, wherein the SOI substrate has a hardmask insulating layer on a top of the second semiconductor layer and every fin of the plurality of fins comprising the portion of the second semiconductor layer and a further portion of the hardmask insulating layer.

3. The method of claim 1, wherein said forming of the plurality of fins is performed using a deep trench mask open patterning.

4. The method of claim 1, wherein the conductive layer comprises TiN, TaC, TaN, TaAlN, TaAlN, W, Mo Ti or Ta.

5. The method of claim 1, wherein the semiconductor material in each DT capacitor structure extending to the second semiconductor layer is a polysilicon.

6. The method of claim 1, wherein the first and second semiconductor layers comprise a dopant of n-type.

7. The method of claim 1, wherein the first or second semiconductor layer in the SOI is made of Si.

8. The method of claim 1, further comprising:
depositing and patterning a trench top oxide or top trench nitride (TTO/TTN) layer to open corresponding fin areas and to form gate areas by leaving the TTO/TTN layer to protect overlapping portions of the fins and the DT capacitors, and
removing conducting material from the corresponding fin areas not covered by the TTO/TTN layer.

9. The method of claim 8, wherein the TTO/TTN layer is a nitride layer.

10. The method of claim 8, further comprising:
annealing the strap to form a silicide on the boundaries between the conductive material and the portion of the second semiconductor layer comprised in each fin and on the boundaries between the conductive material and the semiconductor material in each DT capacitor-extending to the second semiconductor layer.

11. The method of claim 10, wherein temperatures for the annealing is between about 200° C. and 900° C.

12. The method of claim 10, further comprising:
forming passing word lines on the top of the corresponding open fin areas to complete a FIN array FET structure.

13. The method of claim 1, wherein the fins have a thickness from about 5 nm to 15 nm, and a height from about 10 to 35 nm.

14. The method of claim 1, wherein the conductive layer has a thickness from about 5 to 15 nm.

15. The method of claim 1, wherein the DT capacitors have a width of about 50 nm to 200 nm and a depth from about 1000 nm to 10000 nm.

16. The method of claim 1, wherein the first and second semiconductor layer in the SOI are made of a same material.

17. The method of claim 1, wherein the second semiconductor layer is intrinsic or comprise a dopant having a low concentration up to $10^{16}$ atoms/cm$^3$.

18. The method of claim 1, wherein the first semiconductor layer comprise a dopant having a concentration of $10^{17}$-$10^{21}$ atoms/cm$^3$.

19. A data processing system that comprises at least one data processor connected with at least one memory that stores computer program instructions for fabricating an embedded dynamic random access memory (eDRAM) deep trench (DT) strap formation in a fin-shaped field effect transistor (FinFET) device structure by:
providing a semiconductor on insulator (SOI) substrate comprising at least an insulator layer between a first semiconductor layer and a second semiconductor layer;
forming a plurality of deep trench (DT) capacitors in the first semiconductor layer of the SOI substrate for the eDRAM, with a semiconductor material in each DT capacitor extending to the second semiconductor layer;
forming a plurality of fins for FinFETs by selectively removing at least the second semiconductor layer up to a top of the insulator layer, where every fin of the plurality of fins comprises a portion of the second semiconductor layer and at least partially overlaps on the top of the insulator layer with at least two DT capacitors of the plurality of the DT capacitors; and depositing a layer of a conductive material on the fins including side walls to form a strap between the portion of the second semiconductor layer comprised in each fin and the semiconductor material in each DT capacitor-extending to the second semiconductor layer.

20. A computer-readable memory that contains computer program instructions, where the execution of the computer program instructions by at least one data processor results in performance of operations that comprise fabricating an embedded dynamic random access memory (eDRAM) deep trench (DT) strap formation in a fin-shaped field effect transistor (FinFET) device structure by:

providing a semiconductor on insulator (SOI) substrate comprising at least an insulator layer between a first semiconductor layer and a second semiconductor layer;

forming a plurality of deep trench (DT) capacitors in the first semiconductor layer of the SOI substrate for the eDRAM, with a semiconductor material in each DT capacitor extending to the second semiconductor layer;

forming a plurality of fins for FinFETs by selectively removing at least the second semiconductor layer up to a top of the insulator layer, where every fin of the plurality of fins comprises a portion of the second semiconductor layer and at least partially overlaps on the top of the insulator layer with at least two DT capacitors of the plurality of the DT capacitors; and depositing a layer of a conductive material on the fins including side walls to form a strap between the portion of the second semiconductor layer comprised in each fin and the semiconductor material in each DT capacitor-extending to the second semiconductor layer.

* * * * *